(12) United States Patent
Park et al.

(10) Patent No.: US 9,362,437 B1
(45) Date of Patent: Jun. 7, 2016

(54) CONCENTRATED PHOTOVOLTAIC RECEIVER MODULE WITH IMPROVED OPTICAL LIGHT GUIDE ASSEMBLY

(75) Inventors: Sung Sun Park, Gwangjin-gu (KR); Ik Su Jun, Gwanak-gu (KR); Do Won Lee, Ilsandong-gu (KR)

(73) Assignee: Amkor Technology, Inc., Tempe, AZ (US)

( * ) Notice: Subject to any disclaimer, the term of this patent is extended or adjusted under 35 U.S.C. 154(b) by 1044 days.

(21) Appl. No.: 12/815,260

(22) Filed: Jun. 14, 2010

(51) Int. Cl.
*H01L 31/05* (2014.01)
*H01L 31/0203* (2014.01)
*H01L 31/0232* (2014.01)
*H01L 31/054* (2014.01)

(52) U.S. Cl.
CPC ............ *H01L 31/0508* (2013.01); *H01L 31/05* (2013.01); *H01L 31/0203* (2013.01); *H01L 31/02325* (2013.01); *H01L 31/054* (2014.12); *H01L 31/0543* (2014.12)

(58) Field of Classification Search
USPC .................................................. 136/243–293
See application file for complete search history.

(56) References Cited

U.S. PATENT DOCUMENTS

| 4,029,519 | A | * | 6/1977 | Schertz et al. | 136/246 |
| 4,830,678 | A | * | 5/1989 | Todorof et al. | 136/259 |
| 5,460,659 | A | * | 10/1995 | Krut | 136/246 |
| 5,622,873 | A |   | 4/1997 | Kim et al. | |
| 5,990,414 | A | * | 11/1999 | Posnansky | H01L 31/048 136/244 |
| 6,005,287 | A |   | 12/1999 | Kaiya et al. | |
| 6,040,626 | A |   | 3/2000 | Cheah | |
| 6,650,004 | B1 |  | 11/2003 | Horie | |
| 6,794,740 | B1 |  | 9/2004 | Edwards | |
| 6,815,244 | B2 |  | 11/2004 | Böttner et al. | |
| 6,844,615 | B1 |  | 1/2005 | Edwards | |
| 7,002,241 | B1 |  | 2/2006 | Mostafazadeh | |
| 7,737,356 | B2 | * | 6/2010 | Goldstein | 136/251 |
| 7,931,487 | B1 | * | 4/2011 | Cappuccio et al. | 439/395 |
| 2009/0120499 | A1 | * | 5/2009 | Prather et al. | 136/259 |

FOREIGN PATENT DOCUMENTS

| JP | 2009-187971 | * | 8/2009 | H01L 31/042 |
| WO | WO 2010/027083 | * | 3/2010 | H01L 31/042 |

OTHER PUBLICATIONS

Okamoto, machine English translation of JP 2009-187971, 2009, pp. 1-27.*

* cited by examiner

*Primary Examiner* — Thanh-Truc Trinh
(74) *Attorney, Agent, or Firm* — Kevin B. Jackson

(57) ABSTRACT

In accordance with the present invention, there is provided multiple embodiments of a concentrated photovoltaic (CPV) module or package. In each embodiment of the present invention, the CPV module includes a mounting device or holder for use in maintaining an optical member or optical light guide of the module in a prescribed position relative to the solar cell or receiver die thereof.

20 Claims, 11 Drawing Sheets

CONCENTRATED PHOTOVOLTAIC RECEIVER MODULE WITH IMPROVED OPTICAL LIGHT GUIDE ASSEMBLY

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor devices and, more particularly, to a concentrated photovoltaic (CPV) receiver module or package which includes a mounting device or holder for use in maintaining an optical member or optical light guide of the module or package in a prescribed position relative to the solar cell or receiver die thereof.

2. Description of the Related Art

Photovoltaic cells are a well known means for producing electrical current from electromagnetic radiation. Traditional photovoltaic cells comprise junction diodes fabricated from appropriately doped semiconductor materials. Such devices are typically fabricated as thin, flat wafers with the junction formed parallel to and near one of the flat surfaces. Photovoltaic cells are intended to be illuminated through their so-called "front" surface. Electromagnetic radiation absorbed by the semiconductor produces electron-hole pairs in the semiconductor. These electron-hole pairs may be separated by the electric field of the junction, thereby producing a photocurrent. Currently known photovoltaic cells typically have a generally quadrangular (e.g., square) configuration defining four peripheral side edges, and include a pair of bus bars which are disposed on the top or front surface and extend along respective ones of an opposed pair of the side edges. The bus bars are used to facilitate the electrical connection of the photovoltaic cell to another structure, as described in more detail below.

There is currently known in the electrical arts semiconductor devices known as CPV receiver die packages or modules. Currently known CPV modules typically comprise a ceramic substrate having a conductive pattern disposed on one side or face thereof. Attached to the substrate and electrically connected to the conductive pattern are electrical components, including a pair of preformed wire connectors and a packaged diode. Also attached to the substrate and electrically connected to the conductive pattern thereof is a CPV receiver cell or die. The electrical connection between the receiver die and the conductive pattern is often facilitated by a pair of punched thin metal foil or braided ribbon/mesh connectors which extend along and are welded or soldered to respective ones of opposed sides of the receiver die, which typically has a quadrangular or square configuration as indicated above. More particularly, the pair of punched thin metal foils or braided ribbon/mesh connectors are welded or soldered to respective ones of the bus bars on the top or front surface of the receiver die. In certain existing CPV modules, the electrical connection of the receiver die to the conductive pattern is facilitated by the use of multiple wires bonded to the bus bars on the front surface of the receiver die and the bond pads of the conductive pattern of the substrate, the wires being used as an alternative to the aforementioned braided ribbon or mesh interconnects. When wires are used as an alternative to the ribbon/mesh type interconnects, such wires require encapsulation, over-molding or other protection from the environment for long-term reliability of the CPV module including the same.

The CPV module may further include a light concentration means or optical light guide which is adapted to concentrate solar radiation onto the front surface of the receiver die. In this regard, CPV modules typically include a polished glass prism which is operatively connected to the solar cell or receiver die, and is used to guide the focused solar rays to the front surface of the receiver die. The prism also prevents light leak or mis-focused solar energy that may otherwise cause damage to the structures around the receiver die.

However, a drawback in the design of current CPV modules is that the aforementioned prisms require a special optical adhesive to attach the bottom surface thereof to the receiver die. The attachment of the prism to the receiver die through the use of the optical adhesive presents various problems in relation to the functionality of the CPV module. These problems include the possible delamination of the optical adhesive during transport or use of the CPV module, potential light loss through interface reflection or internal absorption, and optical adhesive "creep" on the sides of the prism that may cause light coupling loss or interference between the adhesive and incident light entering through the prism. In this regard, such interference may result in some of the incident light being lost, which in turn results in a lowering of the generation efficiency of electrical energy from the CPV module.

The present invention addresses these and other shortcomings of prior art CPV modules by providing a CPV module or package which includes a mounting device or holder for use in maintaining an optical member or optical light guide of the module or package in a prescribed position relative to the solar cell or receiver die thereof. These, and other features of the present invention will be described in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
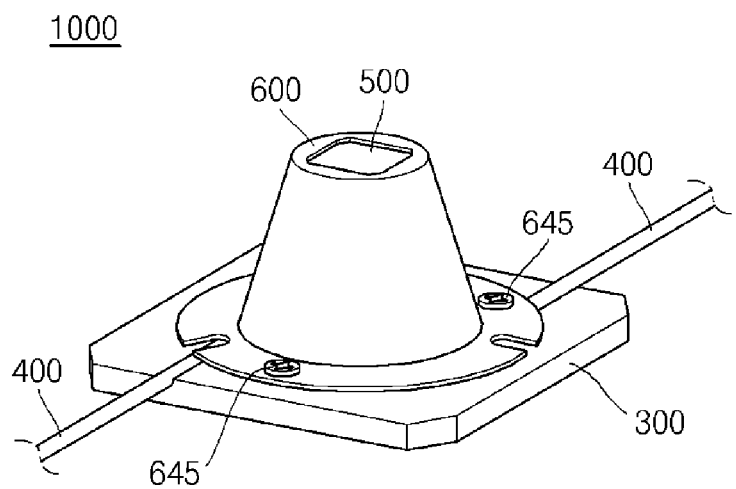
FIG. 1A is a top perspective view of a CPV module constructed in accordance with a first embodiment of the present invention.

Referring now to the drawings wherein the showings are for purposes of illustrating preferred embodiments of the present invention only, and not for purposes of limiting the same, FIGS. 1A-1D depict a CPV module 1000 constructed in accordance with a first embodiment of the present invention. The CPV module 1000 comprises a receiver die assembly 100 which is shown in detail in FIG. 1C. The receiver die assembly 100 itself comprises a generally quadrangular (e.g., square) substrate 110 which defines a generally planar first (top) surface 111 and an opposed, generally planar second (bottom) surface 112. The substrate 110 further includes a peripheral side surface which defines four generally straight peripheral side surface segments. The substrate 110 is preferably fabricated from silicon or ceramic, though the present invention is not intended to be limited to any specific material for the substrate 110.

In addition to the substrate 110, the receiver die assembly 100 comprises a solar cell or receiver die 120 which is attached or coupled to a central area of the first surface 111 of the substrate 110. The receiver die 120 is adapted to receive sunlight, and to convert such sunlight into electrical energy. The receiver 120 itself has a generally quadrangular (e.g., square) configuration, and may be formed as a III-V solar cell, a II-IV solar cell, a silicon solar cell, or the like. More particularly, it is contemplated that the receiver die 120 may include an active layer, a dielectric layer, and a metal layer, with the receiver die 120 receiving photons from the active layer (which defines the active front surface thereof) to generate charge carriers (i.e., holes and electrons) in response to the received photons. To this end, the receiver die 120 may also have three junction layers, including a germanium (Ge) junction layer, a gallium arsenide (GaAs) junction layer and a gallium indium phosphide (GaInP) junction layer. It is contemplated that the aforementioned juncture layers will have different bandgap energies from one another, so that they absorb photons of energies in respective specific ranges.

Figure 1B:
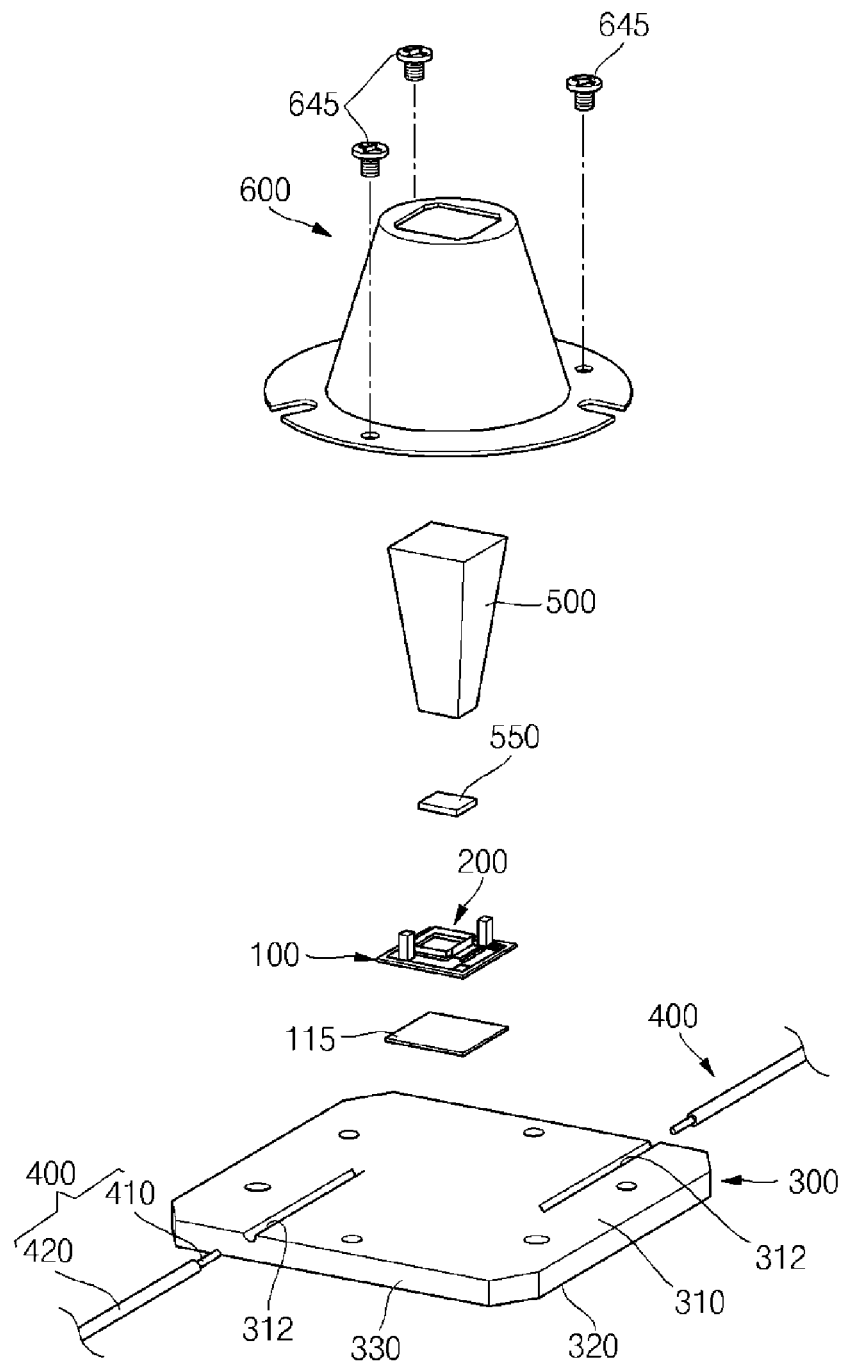
FIG. 1B is an exploded view of the CPV module shown in FIG. 1A.
Figure 1C:
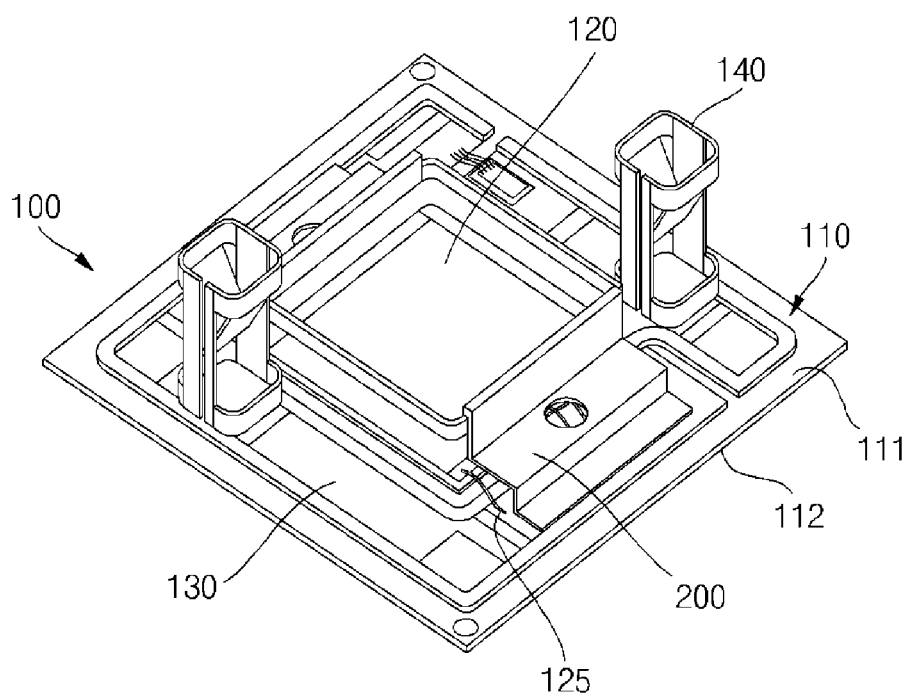
FIG. 1C is an enlarged, top perspective view of the receiver die assembly of CPV module shown in FIG. 1B.
Figure 1D:
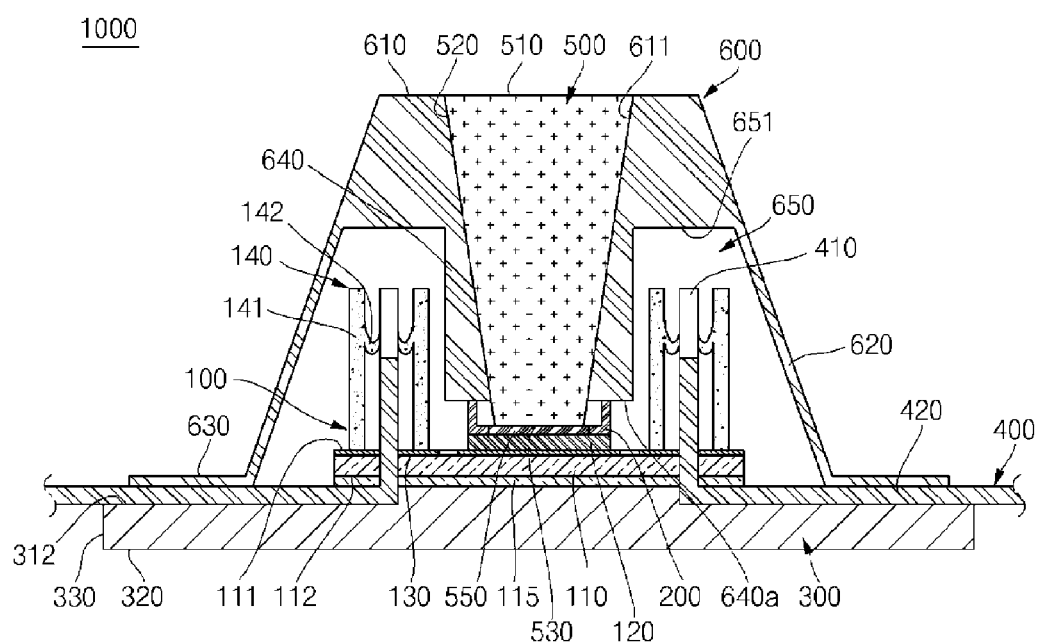
FIG. 1D is a cross-sectional view of the CPV module shown in FIG. 1A.

The receiver die assembly 100 of the CPV module 1000 further comprises a conductive member 130 which is fabricated from a conductive material and is interposed or positioned between the receiver die 120 and the first surface 111 of the substrate 110 in the manner best shown in FIG. 1D. In the receiver die assembly 100, the conductive member 130 is electrically connected to the receiver die 120 through the use of a conductive connecting member 125. In the receiver die assembly 100, the connecting member 125 is preferably a gold wire, though those of ordinary skill in the art will recognize that the connecting member 125 may be fabricated from a conductive material other than for gold. Those of ordinary skill in the art will further recognize that the connecting member 125 also need not necessarily be a wire, and may optionally comprise an alternative structure such as a leadframe, the present invention not being limited to any particular structure for the connecting member 125.

In addition to the aforementioned structural features, the receiver die assembly 100 includes an identically configured pair of connectors 140 which are in contact with the conductive member 130, and protrude generally perpendicularly relative to the first surface 111 of the substrate 110 in the manner best shown in FIGS. 1C and 1D. As further seen in FIG. 1C, the connectors 140 are further positioned on the substrate 110 so as to be located in relative close proximity to respective ones of a diagonally opposed pair of the corner regions defined by the quadrangular receiver die 120. The connectors 140 are sized and configured to facilitate the coupling of respective ones of a pair of wires 400 (shown in FIGS. 1A and 1B) thereto. To this end, each of the connectors 140 preferably includes a base portion 141 which is configured as a generally tubular pillar having a generally square cross-sectional configuration. In addition to the base portion 141, each connector 140 includes a hook portion 142 which is disposed within the interior of the base portion 141. The wires 400 which are ultimately coupled to respective ones of the connectors 140 each comprise an internal conductor 410 covered by an external sheath 420. To facilitate its connection to a corresponding connector 140, each wire 140 is prepared such that an end portion of the conductor 410 protrudes from one end of the corresponding sheath 420 (and is thus exposed) in the manner shown in FIG. 1B. Each connector 140 is configured to allow the corresponding wire 400 to be inserted upwardly into the hollow interior of the base portion 141 thereof, with the exposed end portion of the conductor 410 ultimately being hung on thus electrically connected to the hook portion 142 within the interior of the base portion 141 in the manner best shown in FIG. 1D.

The receiver die assembly 100 further comprises a first (lower) holder member 200 which is attached to a peripheral portion of the receiver die 120 and defines an opening 200a in which the active, front surface of the receiver die 120 is exposed. More particularly, the opening 200a of the first holder member 200 is defined by a generally quadrangular (e.g., square) peripheral wall portion 210 of the first holder member 200. The wall portion 210 itself comprises four wall segments 210a, 210b, 210c, 210d which are arranged in a generally quadrangular pattern and collectively define the opening 200a. In addition to the wall portion 210, the first holder member 200 includes an opposed pair of support portions 220 which protrude laterally from respective ones of the wall segments 210a, 210b of the wall portion 210 in the manner best shown in FIG. 4. As best seen in FIG. 1D, the opening 200a of the first holder member 200 is sized to receive and thus accommodate a lower end portion of an optical light guide 500 of the CPV module 1000. As will be discussed in more detail below, the optical light guide 500 is coupled to the active front surface of the receiver die 120, with the first holder member 200 being adapted to facilitate the proper alignment between the optical light guide 500 and the receiver die 120. It is contemplated that the first holder member 200 may be made of aluminum (Al), copper (Cu), ceramic, or equivalents thereof, though the present invention is not intended to be limited to any particular material for the first holder member 200.

In addition to the receiver die assembly 100 described above, the CPV module 1000 includes a heat spreader 300 which has a generally quadrangular (e.g., square) configuration. As best seen in FIGS. 1A, 1B and 1D, the heat spreader 300 includes a generally planar first (top) surface 310 and an opposed, generally planar second (bottom) surface 320. The heat spreader 300 also includes a peripheral side surface 300 which extends generally perpendicularly between the first and second surfaces 310, 320, and includes at least four peripheral side surface segments. In addition, the heat spreader 300 includes a spaced pair of elongate wire receiving grooves 312 within the first surface 310 thereof, each of the wire receiving grooves 312 extending to respective ones of an opposed pair of the side surface segments defined by the side surface 330. The wire receiving grooves 312 are sized and configured to accommodate portions of respective ones of the above-described wires 400.

In the CPV module 1000, the second surface 112 of the substrate 110 is attached to the first surface 310 of the heat spreader 300 through the use of an adhesive member 115. The adhesive member 115 has a generally quadrangular (e.g., square) configuration with length and width dimensions substantially mirroring those of the substrate 110 of the receiver die assembly 100. It is contemplated that the adhesive member 115 may be made of a silver die adhesive epoxy, thermal grease, curable thermal grease, a silicon adhesive, or equivalents thereto, though the present invention is not intended to be limited to any specific material for the adhesive member 115. In the CPV module 1000, the heat spreader 300 is operative to emit heat generated from the substrate 110. To this end, it is also contemplated that the heat spreader 300 may be made of aluminum or equivalents thereto, though the present invention is not intended to be limited to any specific material for the heat spreader 300. As will be recognized, the heat spreader 300 also serves to support the substrate 110 of the receiver die assembly 100.

As indicated above, the wire receiving grooves 312 of the heat spreader 300 are adapted to receive respective ones of the wires 400, with such wires 400 thereafter being operatively coupled to respective ones of the connectors 140 of the receiver die assembly 100 in the aforementioned manner, i.e., each of the wires 400 is upwardly advanced into the hollow interior of the base portion 141 of a corresponding connector 140, with the exposed portion of the conductor 410 of such wire 400 being hung on the hook portion 142 of the corresponding connector 140. As seen in FIG. 1D, to facilitate its coupling to a corresponding connector 140 in the aforementioned manner, each wire 400 residing within a corresponding wire receiving groove 312 also passes through a respective one of a pair of openings disposed within the substrate 110. These openings each extend between the first and second surfaces 111, 112 of the substrate 110, and are aligned with the hollow interior of the base portion 141 of a respective one of the connectors 140. As further seen in FIG. 1D, when the wires 400 are operatively coupled to the receiver die assembly 100 through the use of respective ones of the connectors 140, the sheath 420 of each of the wires 400 extends between the corresponding wire receiving groove 312 of the heat spreader 300 and the hook portion 142 of the corresponding connector 140. Further, when the wires 400 are received into respective ones of the wire receiving grooves 312, the outermost surface defined by the sheath 420 of each wire 400 is exposed in the first surface 310 of the heat spreader 300, and extends in generally co-planar relation to the first surface 310. However, it is contemplated that the receiving grooves 312 may be formed to have a depth such that when the wires 400 are nested therein in the aforementioned manner, the outermost surface of the sheath 420 is actually positioned lower than or is recessed relative to the first surface 310 of the heat spreader 300, rather than extending in generally co-planar relation thereto.

As indicated above, the CPV module 1000 includes an optical light guide 500 which is coupled to the active front surface of the receiver die 120. The light guide 500 is preferably formed as a pillar-shaped prism which, from the perspective shown in FIG. 1D, has a generally quadrangular (e.g., square) first (top) surface 510, a generally quadrangular (e.g., square) second (bottom) surface 530, and a side surface 520 which extends between the first and second surfaces 510, 530. As is most apparent from FIG. 1B, the side surface 520 defines four separate side surface sections. Additionally, the length and width dimensions of the first surface 510 of the light guide 500 exceed those of the second surface 530 thereof, thus resulting in the side surface 520 having a downwardly tapered configured when viewed from the perspectives shown in FIGS. 1B and 1D. In the CPV module 1000, the second surface 530 of the light guide 500 is operatively coupled to the active top or front surface of the receiver die 120 through the use of a layer 550 of a transparent adhesive. As indicated above, the optical light guide 500 is operative to focus light incident from the sun and transmit such light to the receiver die 120.

The CPV module 1000 of the present invention further comprises a generally conical second (upper) holder member 600 which effectively covers the receiver die assembly 100, but exposes the first surface 510 of the optical light guide 500. As seen in FIGS. 1A, 1B and 1D, it is contemplated that the second holder member 600 may be coupled to the first surface 310 of the heat spreader 300 through the use of coupling members 645 such as screws. The second holder member 600 includes a first (top) surface 610, a second (bottom) surface 630, and a side wall 620 which has a generally circular cross-sectional configuration and extends between the first and second surfaces 610, 630. In the second holder member 600, the diameter of the side wall 620 at its point of transition to the second surface 630 exceeds the diameter of the side wall 620 at its point of transition to the first surface 610. As a result, the second holder member 600 assumes the general configuration of a truncated cone. When the second holder member 600 is operatively coupled to the substrate 300 in the aforementioned manner, the first surface 510 of the optical light guide 500 is exposed in and substantially flush with the first surface 610 of the second holder member 600 in the manner shown in FIG. 1D. As also shown in FIG. 1D, the second holder member 600 includes a tapered inner surface 611 which defines an opening passing axially through the second holder member 600. The inner surface 611 has a configuration which is complimentary to the side surface 520 of the optical light guide 500. In the CPV module 1000, the light guide 500 is nested within the opening defined by the inner surface 611 such that the first surface 510 of the light guide 500 extends in substantially flush relation to the first surface 610 of the second holder member 600 as indicated above.

The CPV module 1000 of the present invention further comprises a generally conical second (upper) holder member 600 which effectively covers the receiver die assembly 100, but exposes the first surface 510 of the optical light guide 500. As seen in FIGS. 1A, 1B and 1D, it is contemplated that the second holder member 600 may be coupled to the first surface 310 of the heat spreader 300 through the use of coupling members 645 such as screws. The second holder member 600 includes a first (top) surface 610, a second (bottom) surface 630, and a side wall 620 which has a generally circular cross-sectional configuration and extends between the first and second surfaces 610, 630. In the second holder member 600, the diameter of the side wall 620 at its point of transition to the second surface 630 exceeds the diameter of the side wall 620 at its point of transition to the first surface 610. As a result, the second holder member 600 assumes the general configuration of a truncated cone. When the second holder member 600 is operatively coupled to the substrate 300 in the aforementioned manner, the first surface 510 of the optical light guide 500 is exposed in and substantially flush with the first surface 610 of the second holder member 600 in the manner shown in FIG. 1D. As also shown in FIG. 1D, the second holder member 600 includes a tapered inner surface 611 which defines an opening passing axially through the second holder member 600. The inner surface 611 has a configuration which is complementary to the side surface 520 of the optical light guide 500. In the CPV module 1000, the light guide 500 is nested within the opening defined by the inner surface 611 such that the first surface 510 of the light guide 500 extends in substantially flush relation to the first surface 610 of the second holder member 600 as indicated above.

In the CPV module 1000, it is contemplated that a first (bottom) surface 640a defined by the block portion 640 may be spaced from the second surface 530 of the optical light guide 500 a distance which is 10% or less than the overall height of the optical light guide 500 between the first and second surfaces 510, 530 thereof. If the distance between the first surface 640a of the block portion 640 and the second surface 530 of the light guide 500 exceeds 10% the overall height of the optical light guide 500, the interference preventing effect otherwise produced by the block portion 640 is reduced.

As is further seen in FIG. 1D, the second holder member 600 includes an open area or gap 650 which is defined between the side wall 620 and the internal block portion 640. Such gap 650 is partially defined by an interior surface 651 of the upper holder member 600, such interior surface 651 facing the connectors 140 of the receiver die assembly 100 and being separated therefrom by a prescribed distance. The spacing between the interior surface 651 and the connectors 140 is adapted to prevent any interference between the wires 400 and the upper holder member 600. It is contemplated that the single gap 650 may comprise separate gaps defined by the second holder member 600 and aligned with respective ones of the connectors 140 of the receiver die assembly 100.

As previously explained, in the CPV module 1000 constructed in accordance with the present invention, the block portion 640 of the second holder member 600 is in contact with the lower portion of the side surface 520 of the optical light guide 500. Thus, the CPV module 1000 is specifically configured to prevent the transparent adhesive layer 550 from excessively moving or migrating upwardly along the side surface 520 of the optical member 500 from the second surface 530 thereof, thereby reducing the interference between the incident light entering through the optical light guide 500 and the transparent adhesive layer 550. This reduction in interference ultimately reduces the loss of the incident light. As a result, the CPV module 1000 provides improved generation efficiency of electrical energy from the receiver die 120 of the receiver die assembly 100 thereof. In addition, in the CPV module 1000 of the present invention, the wires 400 extend through the heat spreader 300 and the substrate 110 prior to being coupled to the connectors 140 of the receiver die assembly 100, thereby allowing for a reduced height of each of the connectors 140 and more efficiently suppressing the interference between the wires 400 and the optical light guide 500. This provides an improvement over those CPV module configurations wherein the wires are downwardly coupled to connectors. As a result, the CPV module 1000 can be manufactured through the implementation of an easier, more simplified manufacturing process.

Having thus described the structural features of the CPV module 1000, an exemplary method of fabricating the same will now be described with specific reference to FIGS. 5 and 6A-6D. More particularly, as set forth in FIG. 5, the exemplary fabrication method comprises the steps of preparing the wires 400 (S1), coupling the receiver die assembly 100 to the wires 400 and heat spreader 300 (S2), coupling the second holder member 600 to the heat spreader 300 (S3), and coupling the optical light guide 500 to the second holder member 600 and receiver die assembly 100 (S4). FIGS. 6A-6D provide illustrations corresponding to these particular steps, as will be discussed in more detail below.

Figure 6A:
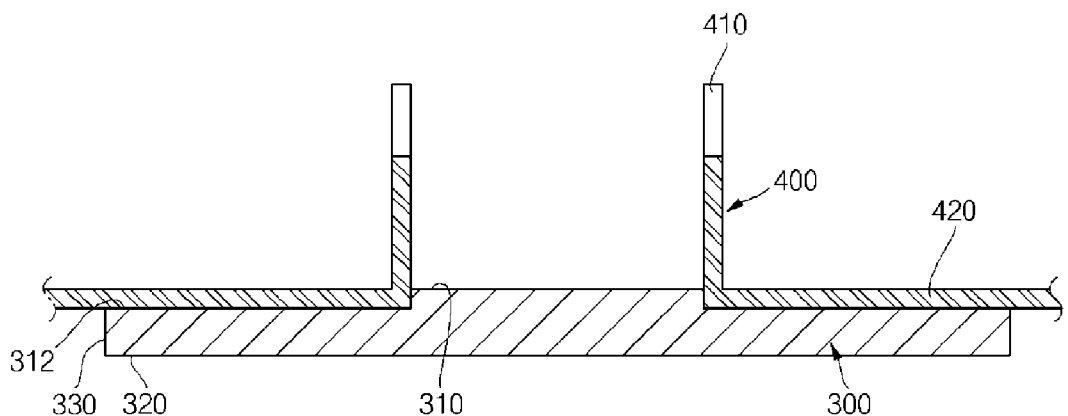
FIGS. 6A-6D are views illustrating an exemplary sequence of steps which may be used to facilitate the fabrication of the CPV module of the first embodiment corresponding to the steps identified in FIG. 5.

Referring now to FIG. 6A, in the initial step S1 of the fabrication process from the CPV module 1000, the wires 400 are advanced into respective ones of the wire receiving grooves 312 formed in the first surface 310 of the heat spreader 300 in the aforementioned manner. More particularly, as seen in FIG. 6A, the wires 400 are prepared such that the internal conductors 400 thereof protrude from respective ones of the sheathes 420, with the wires 400 being bent such that end portions thereof including the exposed internal conductors 410 extend generally perpendicularly relative to the first surface 310 of the heat spreader 300. As indicated above, for those portions of the wires 400 residing within the wire receiving grooves 312, the sheathes 420 extend in generally co-planar relation to, or are recessed relative to, the first surface 310 of the heat spreader 300, with the wires 400 further protruding from respective ones of an opposed pair of the side surface segments of the side surface 330 of the heat spreader 300.

Figure 6B:
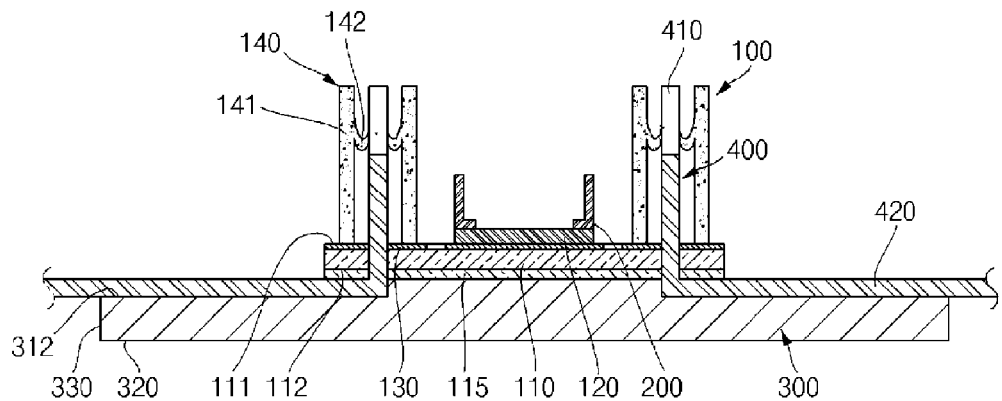

In the next step S2 of the fabrication process for the CPV module 1000 shown in FIG. 6B, the fully fabricated receiver die assembly 100 is coupled to the heat spreader 300. More particularly, the second surface 112 of the substrate 110 is coupled to the first surface 310 of the heat spreader 300 using the adhesive member 115. Such attachment is facilitated in a manner wherein those portions of the wires 400 extending generally perpendicularly relative to the first surface 310 of the heat spreader 300 are advanced through respective ones of the aforementioned openings disposed within the substrate 110, and (when viewed from the perspective shown in FIG. 6B) upwardly into the base portions 141 of respective ones of the connectors 140. As also explained above, the exposed portions of the internal conductors 410 of the wires 400 are hung onto and thus electrically connected to the hook portions 142 of respective ones of the connectors 140.

Figure 6C:
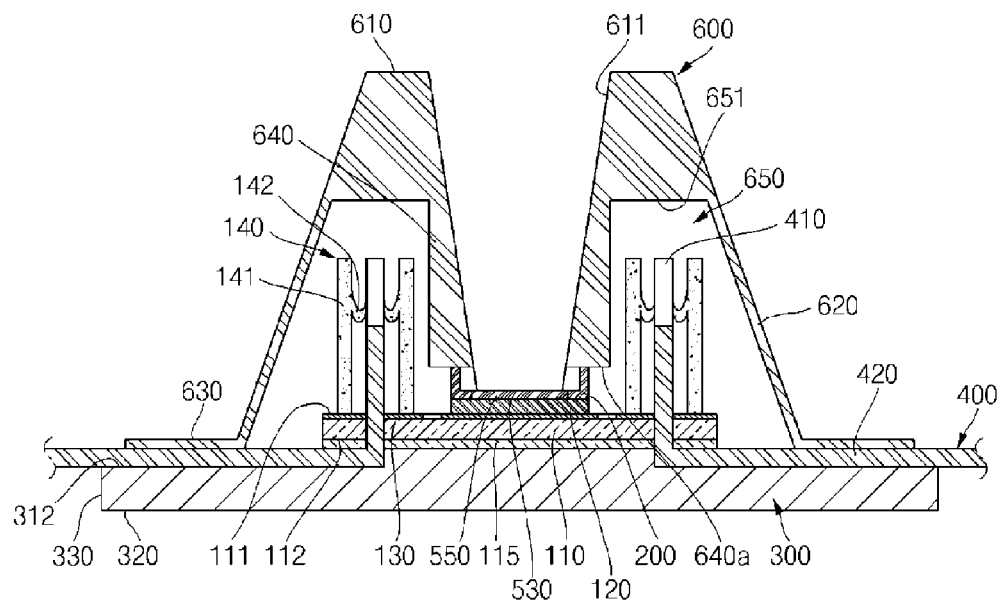

In the next step S3 of the fabrication process for the CPV module 1000 shown in FIG. 6C, the second holder member 600 is coupled to the first surface 310 of the heat spreader 300 in the aforementioned manner through the use of the coupling members 645. As explained above, the second holder member 600, when attached to the heat spreader 300, covers the receiver die assembly 100. However, as is apparent from FIG. 6C, the opening of the second holder member 600 defined by the inner surface 611 thereof is aligned with and exposes the active front surface of the receiver die 120 of the receiver die assembly 100.

Figure 6D:
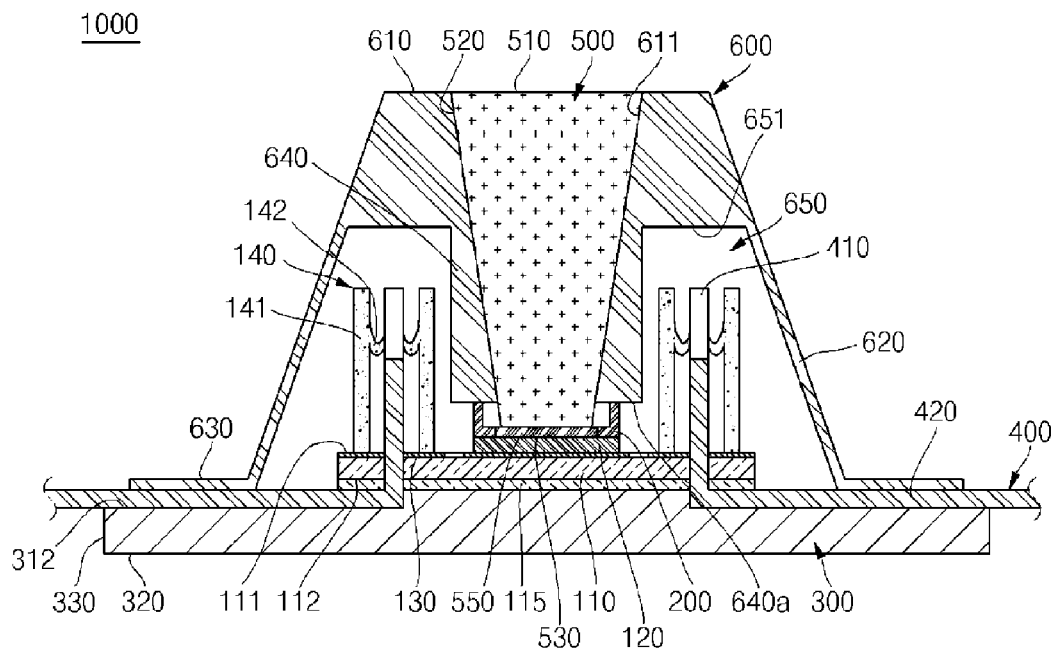

In the final step S4 of the fabrication process for the CPV module 1000 shown in FIG. 6D, the optical light guide 500 is advanced into the aforementioned opening of the second holder member 600. The advancement of the optical light guide 500 into the opening defined by the inner surface 611 results in the block portion 640 of the second holder member 600 coming into direct contact with at least the lower portion of the side surface 520 of the optical light guide 500. The second surface 530 of the optical light guide 500 is further secured to the active front surface of the receiver die 120 through the use of the transparent adhesive layer 550. Further, the optical light guide 500 is sized relative to the other structural features of the CPV module 1000 such that, when the second surface 530 is operatively secured to the receiver die 120 through the use of the transparent adhesive layer 550, the first surface 510 of the optical light guide 500 extends in substantially flush or co-planar relation to the first surface 610 of the second holder member 600.

Figure 2:
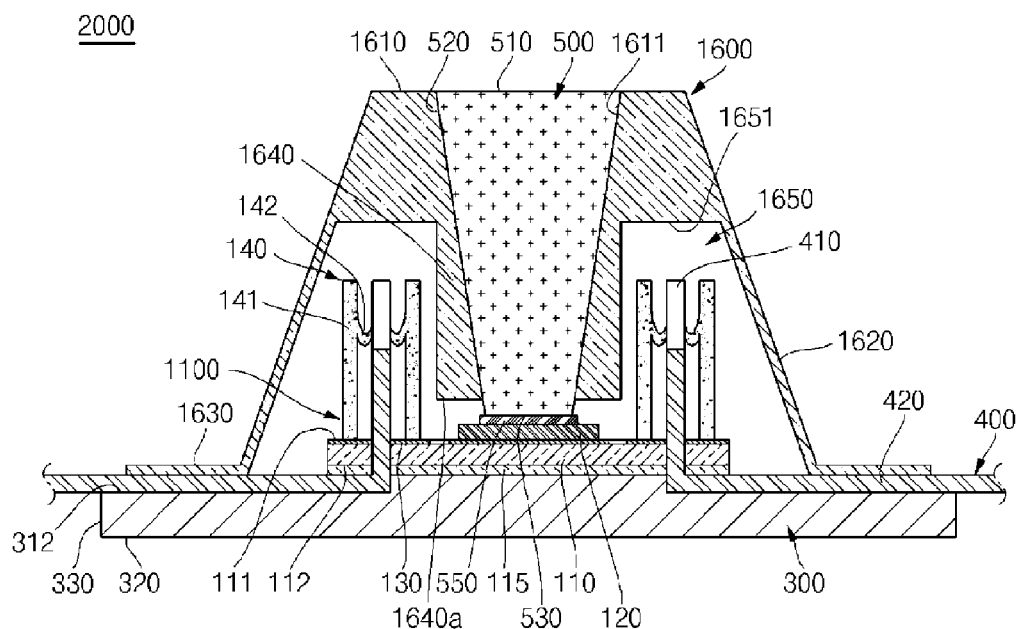
FIG. 2 is a cross-sectional view of a CPV module constructed in accordance with a second embodiment of the present invention.

Referring now to FIG. 2, there is shown a CPV module 2000 constructed in accordance with a second embodiment of the present invention. The CPV module 2000 has substantial structural similarity to the CPV module 1000 described above, with only the distinctions between the CPV modules 2000, 1000 being described below.

A first distinction between the CPV modules 2000, 1000 lies in the configuration of the receiver die assembly 1100 included in the CPV module 2000, in comparison to the receiver die assembly 100 included in the CPV module 1000. More particularly, the receiver die assembly 1100 does not include the first holder member 200 described above in relation to the receiver die assembly 100. Other than for the omission of the first holder member 200, the receiver die assembly 1100 is identically configured to the receiver die assembly 100 in all other respects.

The only other distinction between the CPV modules 2000, 1000 lies in the configuration of the second holder member 1600 of the CPV module 2000 in comparison to the second holder member 600 of the CPV module 1000. Like the second holder member 600, the second holder member 1600 includes a first surface 1610, a second surface 1630, and a sidewall 1620 which has a generally circular cross-sectional configuration and extends between the first and second surfaces 1610, 1630. The second holder member 1600, like the second holder member 600, also has the general configuration of a truncated cone. The second holder member 1600 also includes a tapered inner surface 1611 which defines an opening passing axially through the second holder member 1600, with the inner surface 1611 also having a configuration which is complimentary to the side surface 520 of the optical light guide 500. As seen in FIG. 2, in the CPV module 2000, the light guide 500 is nested within the opening defined by the inner surface 1611 such that the first surface 510 of the light guide 500 extends in substantially flush relation to the first surface 1610 of the second holder member 1600.

Though, as in the second holder member 1600, a portion of the inner surface 1611 is defined by an internal block portion 1640 of the second holder member 1600, the internal block portions 1640, 640 of the second holder members 1600, 600 are not identically configured. Rather, when viewed from the perspectives shown in FIGS. 1D and 2, the length of the block portion 1640 of the second holder member 1600 (i.e., the distance the block portion 1640 protrudes from the interior surface 1651 of the second holder member 1600) exceeds the length of the block portion 640 of the second holder member 600 (i.e., the distance the block portion 640 protrudes from the interior surface 651 of the second holder member 600). As also in the second holder member 600, a gap 1650 is defined between the block portion 1640 and side wall 1620 in the second holder member 1600.

Thus, in the CPV module 2000 including the second holder member 1600, the first surface 1640a defined by the block portion 1640 is positioned in closer proximity to the transparent adhesive layer 550, with such closer positioning being made possible by the aforementioned omission or absence of the first holder member 200 in the receiver die assembly 1100 of the CPV module 2000. The positioning of the block portion 1640, and in particular the first surface 1640a thereof, in closer proximity to the receiver die 120 and transparent adhesive layer 550 effectively prevents the transparent adhesive layer 550 from moving or migrating excessively upwardly along the side surface 520 of the optical light guide 500, thus providing the same operational advantages in the CPV module 2000 as described above in relation to the CPV module 1000. Further, the omission of the first holder member 200 in the receiver die assembly 1100 effectively reduces the manufacturing cost for the CPV module 2000 while further simplifying the manufacturing process as well. Those of ordinary skill in the art will recognize that in the CPV module 2000, the length of the block portion 1640 (i.e., the distance by which the block portion 1640 protrudes from the interior surface 1651) may be slightly varied from that shown in FIG. 2 as may be needed to achieve the greatest level of prevention in relation to the loss of incident light.

Figure 7:
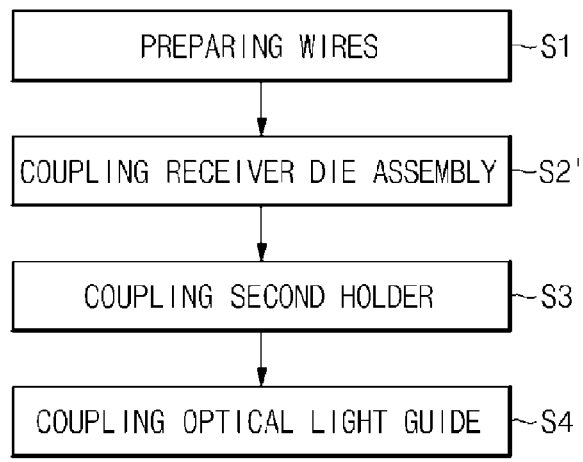
FIG. 7 is a flow chart identifying an exemplary sequence of steps which may be used to facilitate the fabrication of the CPV module of the second embodiment shown in FIG. 2.

Having thus described the structural features of the CPV module 2000 an exemplary method of fabricating the same will now be described with specific reference to FIGS. 7 and 8. More particularly, as set forth in FIG. 7, the exemplary fabrication method comprises the steps of preparing the wires 400 (S1), coupling the receiver die assembly 1100 to the wires 400 and heat spreader 300 (S2'), coupling the second holder member 1600 to the heat spreader 300 (S3), and coupling the optical light guide 500 to the second holder member 1600 and receiver die assembly 1100 (S4). The steps S1, S3 and S4 of the fabrication method for the CPV module 2000 are essentially the same as those described above in relation to the fabrication method for the CPV module 1000. In this regard, FIG. 8 provides an illustration corresponding to step S2' related to the fabrication process for the CPV module 2000, such step S2' being substantially similar to step S2 of the fabrication process for the CPV module 1000.

Figure 8:
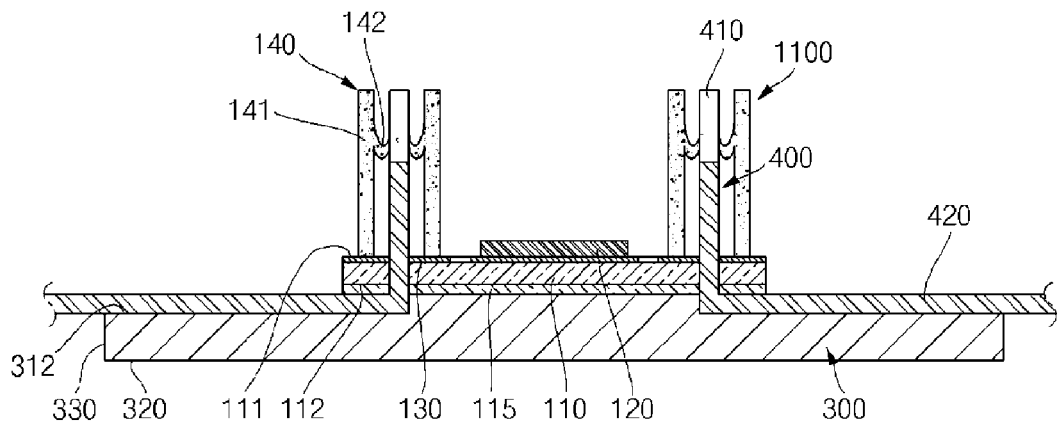
FIG. 8 is a view illustrating one of the steps in the exemplary sequence of steps which may be used to facilitate the fabrication of the CPV module of the second embodiment corresponding to the steps identified in FIG. 7.

In step S2' for the CPV module 2000 shown in FIG. 8, the second surface 112 of the substrate 110 of the receiver die assembly 1100 is coupled to the first surface 310 of the heat spreader 300 through the use of the adhesive member 115. However, since the receiver die assembly 1100 is not provided with the first holder member 200 described above in relation to the receiver die assembly 100, the receiver die assembly 1100 is able to accommodate the increased length block portion 1640 of the second holder member 1600 when the same is attached to the heat spreader 300 in step S3 of the fabrication method for the CPV module 2000.

Figure 3:
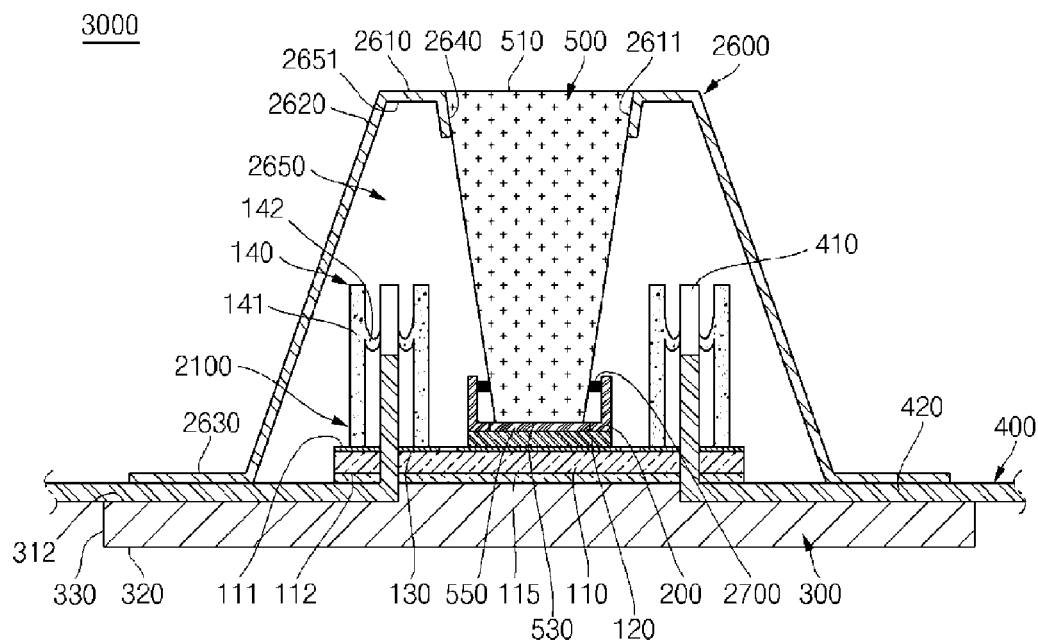
FIG. 3 is a cross-sectional view of a CPV module constructed in accordance with a third embodiment of the present invention.
Figure 4:
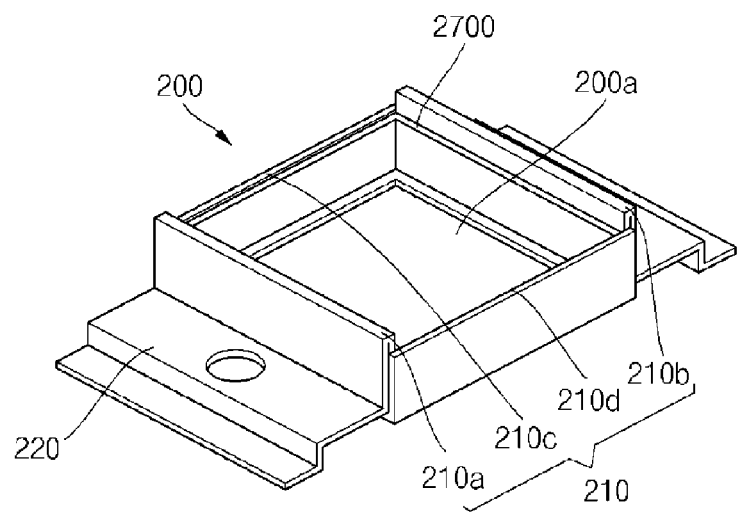
FIG. 4 is a top perspective view of the holder member of the receiver die assembly included in the CPV modules shown in FIGS. 1D and 3, the holder member used in conjunction with the CPV module shown in FIG. 3 further including a block member.
Figure 5:
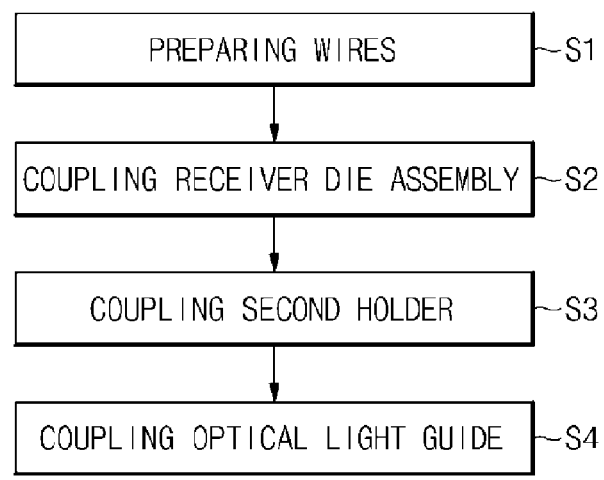
FIG. 5 is a flow chart identifying an exemplary sequence of steps which may be used to facilitate the fabrication of the CPV module of the first embodiment shown in FIGS. 1A-1D.

Referring now to FIGS. 3 and 4, there is shown a CPV module 3000 constructed in accordance with a third embodiment of the present invention. The CPV module 3000 also has substantial structural similarity to the CPV module 1000 described above, with only the distinctions between the CPV modules 3000, 1000 being described below.

A first distinction between the CPV modules 3000, 1000 lies in the configuration of the receiver die assembly 2100 included in the CPV module 2000, in comparison to the receiver die assembly 100 included in the CPV module 1000. More particularly, the receiver die assembly 2100 is substantially identical to the receiver die assembly 100, except that in the receiver die assembly 2100, the peripheral wall portion 210 of the first holder member 200 is provided with a generally quadrangular (e.g., square), frame-like block member 2700. As best shown in FIG. 4, the block member 2700 extends about, and protrudes inwardly at a prescribed distance from, the inner surfaces of each of the four wall segments 210a, 210b, 210c, 210d of the peripheral wall portion 210 which defines the opening 200a of the first holder member 200. The block member 2700 may be formed by coating rubber or a suitable sealing agent on the inner surfaces of the four wall segments 210a, 210b, 210c, 210d. As will be described in more detail below, in the CPV module 3000, the block member 2700 performs a similar function to the block portion 640 of the second holder member 600 in the CPV module 1000.

Another distinction between the CPV modules 3000, 1000 lies in the configuration of the second holder member 2600 of the CPV module 3000 in comparison to the second holder member 600 of the CPV module 1000. In the CPV module 3000, the generally conical second holder member 2600 effectively covers the receiver die assembly 200, but exposes the first surface 510 of the optical light guide 500. The second holder member 2600 includes a first (top) surface 2610, a second (bottom) surface 2630, and a side wall 2620 which has a generally circular cross-sectional configuration and extends between the first and second surfaces 2610, 2630. In the second holder member 2600, the diameter of the side wall 2620 at its point of transition to the second surface 2630 exceeds the diameter of the side wall 2620 at its point of transition to the first surface 2610. As a result, the second holder member 2600 assumes the general configuration of a truncated cone. When the second holder member 2600 is operatively coupled to the substrate 300, the first surface 510 of the optical light guide 500 is exposed in and substantially flush with the first surface 2610 of the second holder member 2600 in the manner shown in FIG. 3.

As also shown in FIG. 3, the second holder member 2600 does not include the block portion 640 described above in relation to the second holder member 600. Rather, the second holder member 2600 includes an internal support wall 2640 having a tapered inner surface 2611 which defines an opening extending from the first surface 2610 into communication with an open interior chamber 2650 of the second holder member 2600. The inner surface 2611 has a configuration which is complimentary to the upper portion of the side surface 520 of the optical light guide 500. In the CPV module 3000, the light guide 500 is nested within the opening defined by the inner surface 2611 of the support wall 2640 such that the first surface 510 of the light guide 500 extends in substantially flush relation to the first surface 2610 of the second holder member 2600 as indicated above. When viewed from the perspective shown in FIG. 3, the inner surface 2611 is in contact with the upper portion of the side surface 520 of the optical light guide 500.

When also viewed from the perspective shown in FIG. 3, in the CPV module 3000, the lower portion of the optical light guide 500 is advanced into the opening 200a of the first holder member 200 as a precursor to the second surface 530 being operatively coupled to the active front surface of the receiver die 120 through the use of the transparent adhesive layer 550. The advancement of the optical light guide 500 into the opening 200a results in the generally quadrangular block member 2700 being firmly seated against a lower portion of the side surface 520 of the optical light guide 500. More particularly, those segments of the block member 2700 extending along the inner surfaces of respective ones of the four wall segments 210a, 210b, 210c, 210d of the peripheral wall portion 210 are abutted against respective ones of the side surface sections defined by the side surface 520. Like the block portion 640 described above in relation to the second holder member 600, the block member 2700 is operative to prevent interference between the transparent adhesive layer 550 and incident light by preventing the transparent adhesive layer 550 from excessively moving or migrating upwardly along the side surface 520 of the optical light guide 500 from the second surface 530 thereof. Thus, the block member 2700 imparts the same functional advantages to the CPV module 3000 as does the block portion 640 included in the second holder member 600 of the CPV module 1000. Further, the relatively large interior chamber 2650 defined by the second holder member 2600 in the CPV module 3000 effectively reduces any potential interference between the wires 400 and the second holder member 2600. The substitution of the block portion 640 with the block member 2700 also allows the CPV module 3000 to be fabricated through the implementation of a simplified fabrication process.

Figure 9:
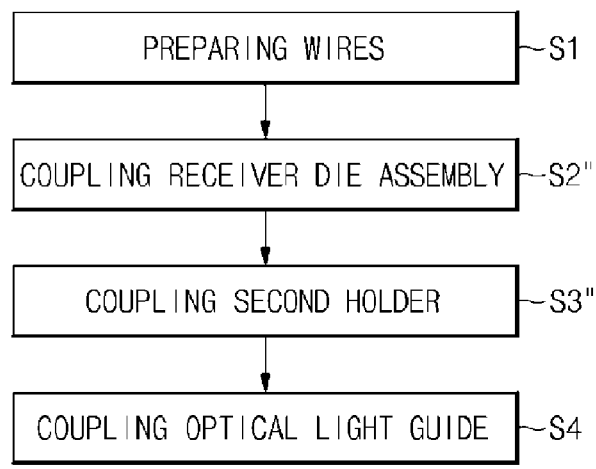
FIG. 9 is a flow chart identifying an exemplary sequence of steps which may be used to facilitate the fabrication of the CPV module of the third embodiment shown in FIG. 3.
Figure 10:
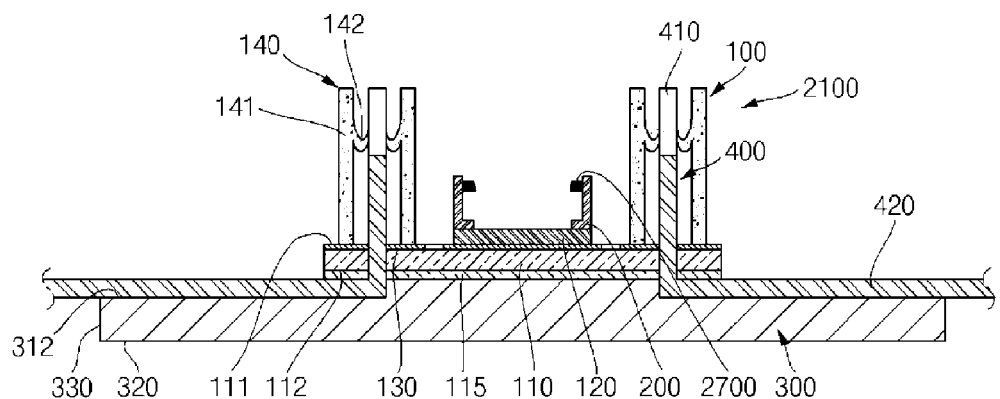
FIGS. 10 and 11 are views illustrating two of the steps in the exemplary sequence of steps which may be used to facilitate the fabrication of the CPV module of the third embodiment corresponding to the steps identified in FIG. 9.

Having thus described the structural features of the CPV module 3000 an exemplary method of fabricating the same will now be described with specific reference to FIGS. 9-11. More particularly, as set forth in FIG. 9, the exemplary fabrication method comprises the steps of preparing the wires 400 (S1), coupling the receiver die assembly 2100 to the wires 400 and heat spreader 300 (S2"), coupling the second holder member 2600 to the heat spreader 300 (S3"), and coupling the optical light guide 500 to the second holder member 2600 and receiver die assembly 1100 (S4). The steps S1 and S4 of the fabrication method for the CPV module 3000 are essentially the same as those described above in relation to the fabrication method for the CPV module 1000. In this regard, FIG. 10 provides an illustration corresponding to step S2" related to the fabrication process for the CPV module 3000, such step S2" being substantially similar to step S2 of the fabrication process for the CPV module 1000. Similarly, FIG. 11 provides an illustration corresponding to step S3" related to the fabrication process for the CPV module 3000, such step S3" being substantially similar to step S3 of the fabrication process for the CPV module 1000.

In step S2" for the CPV module 3000 shown in FIG. 10, the second surface 112 of the substrate 110 of the receiver die assembly 2100 is coupled to the first surface 310 of the heat spreader 300 through the use of the adhesive member 115. However, as indicated above, the receiver die assembly 2100 is formed so as to include the block member 2700 upon the inner surfaces of each of the four wall segments 210a, 210b, 210c, 210d of the peripheral wall portion 210.

Figure 11:
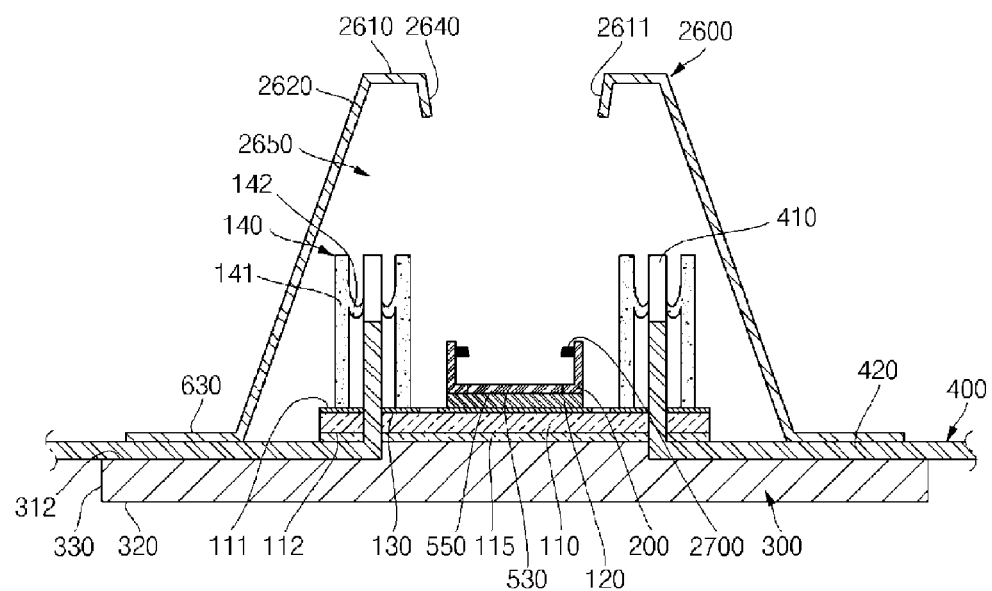

In step S3" for the CPV module 3000 shown in FIG. 11, the second holder member 2600, having a configuration which differs from the second holder member 600 as described above, is coupled to the first surface 310 of the heat spreader 300. The second holder member 2600, when attached to the heat spreader 300, covers the receiver die assembly 2100. However, as is apparent from FIG. 11, the opening of the second holder member 2600 defined by the inner surface 2611 of the support wall 2640 thereof is aligned with and exposes the active front surface of the receiver die 120 of the receiver die assembly 2100.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:
1. A concentrated photovoltaic module, comprising:
   a receiver die assembly including a receiver die and a first connector protruding generally perpendicular relative to a first surface of the receiver die assembly, wherein the first connector is configured to upwardly receive a first wire;

an optical light guide including a first surface, an opposed second surface which is operatively coupled to the receiver die, and a side surface which extends between the first and second surfaces and comprises a plurality of side surface sections; and an upper holder member covering the receiver die assembly, the upper holder member including an external generally horizontal upper surface proximate to the first surface of the optical light guide, a side surface extending in a generally sloped vertical direction from the external upper surface to the receiver die assembly, an inner surface extending in a generally sloped vertical direction from the external upper surface towards the receiver die, and a generally horizontal interior surface extending between the inner surface and the side surface and facing the first connector, wherein the inner surface, the side surface, and the generally horizontal interior surface define a space within the concentrated photovoltaic module having a shape that accommodates the first connector within the space, and wherein the inner surface contacts at least a portion of each of the side surface sections of the optical light guide.

2. The concentrated photovoltaic module of claim 1 wherein the inner surface of the upper holder member is at least partially defined by an internal block portion thereof, the block portion defining a first interior surface that terminates along the side surface between the first surface and the second surface of the optical light guide, wherein the first interior surface is separated from the second surface of the optical light guide by a prescribed distance.

3. The concentrated photovoltaic module of claim 2 wherein the optical light guide is of a prescribed height between the first and second surfaces thereof, and the prescribed distance between the first interior surface of the block portion and the second surface of the optical light guide is not greater than about 10% of the height of the optical light guide.

4. The concentrated photovoltaic module of claim 1 wherein the external upper surface of the upper holder member extends in generally coplanar relation to the first surface of the optical light guide.

5. The concentrated photovoltaic module of claim 1 wherein the receiver die assembly further comprises:
a substrate having the receiver die mounted thereto, the receiver die being electrically connected to the substrate, wherein the first connector is disposed on and electrically connected to the substrate proximate the receive die; and
a second connector disposed on and electrically connected to the substrate proximate the receiver die and protruding generally perpendicular relative to the first surface of the receiver die assembly, wherein the second connector is configured for upwardly receiving a second wire, the substrate including a pair of openings which extend therethrough and are aligned with respective ones of the connectors, and wherein the shape of the space further accommodates the second connector.

6. The concentrated photovoltaic module of claim 5 wherein each of the first and second connectors comprises:
a tubular base portion defining an open interior; and
a hook portion disposed within the interior of the base portion.

7. The concentrated photovoltaic module of claim 6 further comprising the first wire and the second wire each advanced through a respective one of the openings of the substrate and into the interior of the base portion of a respective one of the first and second connectors, each of the first and second wires being electrically connected to the hook portion of a respective one of the first and second connectors.

8. The concentrated photovoltaic module of claim 7 further comprising a heat spreader defining a first surface, the substrate of the receiver die assembly and the upper holder member each being mounted to the first surface of the heat spreader.

9. The concentrated photovoltaic module of claim 8 wherein the heat spreader includes at least two wire receiving grooves which are formed in the first surface thereof and are sized to receive respective ones of the first and second wires in a manner allowing portions of the first and second wires to extend between the heat spreader and the substrate to and through the openings within the substrate.

10. The concentrated photovoltaic module of claim 9 wherein each of the grooves is sized and configured such that those portions of the first and second wires residing therein extend in generally coplanar relation to or below the first surface of the heat spreader.

11. The concentrated photovoltaic module of claim 5 wherein the receiver die assembly further comprises a lower holder member which is attached to the receiver die and is sized and configured to facilitate the alignment of the light guide with the receiver die.

12. The concentrated photovoltaic module of claim 11 wherein the lower holder member attached to the receiver die includes a block member which contacts a least a portion of each of the side surface sections of the optical light guide.

13. The concentrated photovoltaic module of claim 11 wherein the inner surface of the upper holder member is at least partially defined by an internal block portion thereof, the block portion defining a first interior surface which is separated from the second surface of the optical light guide by a prescribed distance, with the lower holder member attached to the receiver die extending between the receiver die and the first interior surface of the block portion.

14. A concentrated photovoltaic module, comprising:
a receiver die assembly including a receiver die and a first connector protruding generally perpendicular relative to a first surface of the receiver die assembly, wherein the first connector is configured for upwardly receiving a first wire;

an optical light guide including a first surface, an opposed second surface which is operatively coupled to the receiver die, and a side surface which extends between the first and second surfaces and comprises a plurality of side surface sections, the optical light guide being of a prescribed height between the first and second surfaces thereof; and an upper holder member covering the receiver die assembly, the upper holder member including an external generally horizontal upper surface spaced apart from the receiver die and proximate to the first surface, a side surface extending in a generally sloped vertical direction from the external upper surface to the receiver die assembly, an inner surface extending in a generally sloped vertical direction from the external upper surface towards the receiver die, and a generally horizontal interior surface extending between the inner surface and the side surface and facing the first connector, wherein the inner surface, the side surface, and the generally horizontal interior surface define a space within the concentrated photovoltaic module having a shape that accommodates the first connector within the space, and wherein the inner surface contacts at least a portion of each of the side surface sections of the optical light guide, one end of the inner surface extending to an interior first surface of the upper holder member which is separated from the second surface of the optical light guide by a prescribed distance.

15. The concentrated photovoltaic module of claim 14 wherein the prescribed distance between the interior first surface of the upper holder member and the second surface of the optical light guide is not greater than about 10% of the height of the optical light guide.

16. The concentrated photovoltaic module of claim 14 further comprising a heat spreader defining a first surface, the receiver die assembly and the upper holder member each being mounted to the first surface of the heat spreader.

17. The concentrated photovoltaic module of claim 14 wherein the external upper holder member further defines an exterior first surface which extends in generally coplanar relation to the first surface of the light guide.

18. The concentrated photovoltaic module of claim 14 wherein the receiver die assembly further comprises:
   a substrate having the receiver die mounted thereto, the receiver die being electrically connected to the substrate, wherein the first connector is disposed on and electrically connected to the substrate proximate the receive die;
   a second connector disposed on and electrically connected to the substrate proximate the receiver die and protruding generally perpendicular relative to the first surface of the receiver die assembly, wherein the second connector is configured for upwardly receiving a second wire, the substrate including a pair of openings which extend therethrough and are aligned with respective ones of the connectors, and wherein the shape of the space further accommodates the second connector.

19. The concentrated photovoltaic module of claim 18 further comprising the first and second wires which are each advanced through a respective one of the openings of the substrate and into the interior of a respective one of the first and second connectors, each of the first and second wires being electrically connected to a respective one of the first and second connectors.

20. A concentrated photovoltaic module, comprising:
   a receiver die attached to a substrate;
   a pair of connectors disposed on the substrate and protruding generally perpendicular relative to a first surface of the substrate, wherein each connector is configured to upwardly receive a conductor;
   an optical light guide including a first surface, an opposed second surface which is operatively coupled to the receiver die, and a side surface which extends between the first and second surfaces and comprises a plurality of side surface sections, wherein the optical light guide is of a height between the first and second surfaces thereof; and
   an upper holder member covering the receiver die and having an external generally horizontal upper surface spaced apart from the receiver die and proximate to the first surface of the optical light guide, a side surface extending in a generally vertical direction from the external upper surface to the receiver die assembly, an inner surface extending in a generally vertical direction from the external upper surface towards the receiver die, and a generally horizontal interior surface extending between the inner surface and the side surface, wherein the inner surface, the side surface, and the generally horizontal interior surface define a space within the concentrated photovoltaic module having a shape configured to accommodate the pair of connectors within the space, and wherein the inner surface contacts the optical light guide.

* * * * *